United States Patent
Chiang (10) Patent No.: US 10,321,239 B2
(45) Date of Patent: Jun. 11, 2019

(54) MICROPHONE

(71) Applicant: MASCOT ELECTRIC CO., LTD., Tainan (TW)

(72) Inventor: Kun-Tien Chiang, Tainan (TW)

(73) Assignee: Mascot Electric Co., Ltd., Tainan (TW)

(*) Notice: Subject to any disclaimer, the term of this patent is extended or adjusted under 35 U.S.C. 154(b) by 0 days.

(21) Appl. No.: 15/805,218

(22) Filed: Nov. 7, 2017

(65) Prior Publication Data

US 2018/0376250 A1 Dec. 27, 2018

(30) Foreign Application Priority Data

Jun. 22, 2017 (TW) .............................. 106209054 U (51) Int. Cl.
| | |
|---|---|
| *H04R 1/04* | (2006.01) |
| *H04R 1/08* | (2006.01) |
| *H04R 9/08* | (2006.01) |
| *G01R 31/36* | (2019.01) |
| *H04R 19/04* | (2006.01) |
| *H04R 5/027* | (2006.01) |

(52) U.S. Cl.
CPC ................ *H04R 9/08* (2013.01); *H04R 1/08* (2013.01); *H04R 5/027* (2013.01); *H04R 19/04* (2013.01); *G01R 31/3646* (2019.01); *H04R 1/04* (2013.01)

(58) Field of Classification Search
CPC combination set(s) only.
See application file for complete search history.

(56) References Cited

U.S. PATENT DOCUMENTS

| | | | |
|---|---|---|---|
| 6,463,159 B1 * | 10/2002 | Ming-Cheng | H04R 1/08 381/355 |
| 6,968,070 B1 * | 11/2005 | Chiang | H04R 1/08 381/355 |
| 8,243,974 B2 * | 8/2012 | Cheng | H04R 1/04 381/355 |

* cited by examiner

*Primary Examiner* — Sunita Joshi
(74) *Attorney, Agent, or Firm* — Burris Law, PLLC (57) ABSTRACT

A microphone includes a main body surrounding a longitudinal axis that extends in a top-bottom direction, a battery holder mounted to the main body, and a protective cover. The protective cover has a cover body pivotally connected to and openably covering the battery holder for retaining a battery therein, and a positioning unit connected to the cover body. The protective cover is pivotable about a pivot axis transverse to the top-bottom direction to turn upward and downward and to move between a closed position, where the positioning unit engages the battery holder, and an opened position, where the positioning unit is disengaged from the battery holder in a direction transverse to the top-bottom direction.

4 Claims, 8 Drawing Sheets

MICROPHONE

CROSS-REFERENCE TO RELATED APPLICATION

This application claims priority of Taiwanese Patent Application No. 106209054, filed on Jun. 22, 2017.

FIELD

The disclosure relates to a microphone, and more particularly to a microphone having a battery holder.

BACKGROUND

Figure 1:
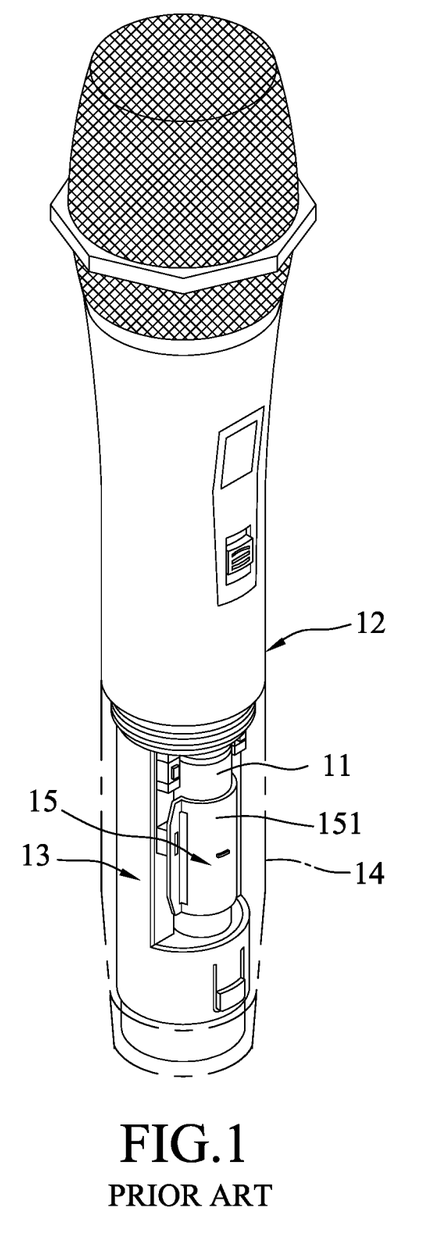
FIG. 1 is a perspective view of a conventional microphone, illustrating a battery holder that retains a battery therein.
Figure 2:
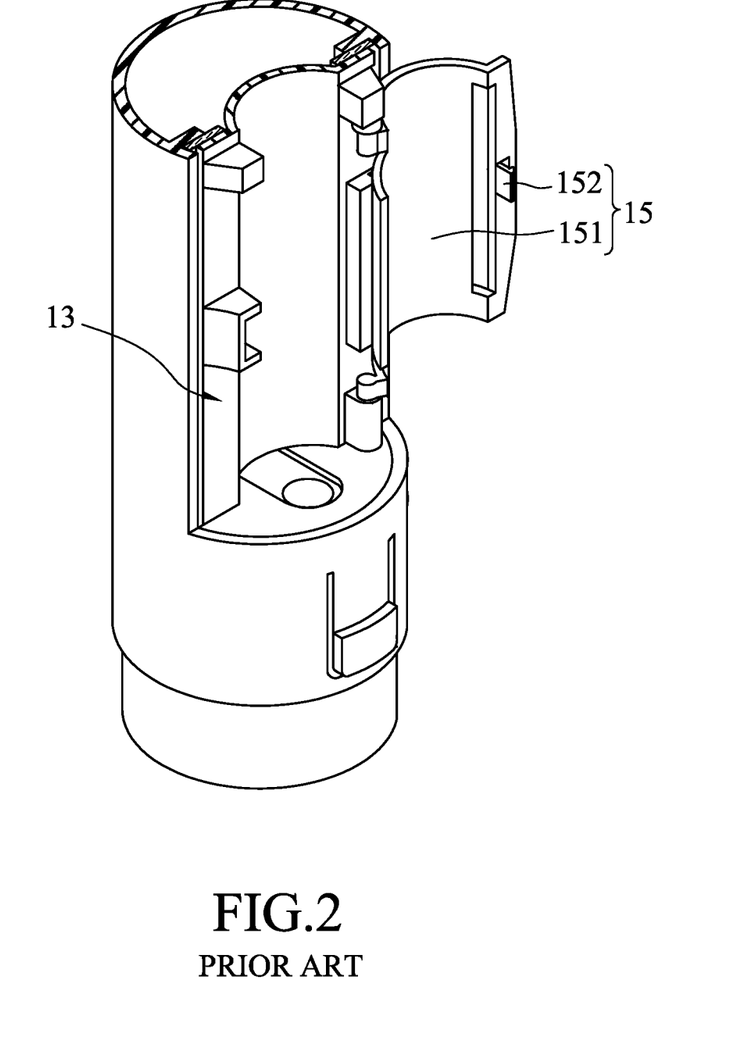
FIG. 2 is a fragmentary perspective view of the conventional microphone, illustrating a protective cover that is opened relative to the battery holder.

Referring to FIGS. 1 and 2, a conventional battery-powered microphone is adapted for use with a battery 11, and includes a main body 12, a battery holder 13, a sleeve member 14, and a protective cover 15. The main body 12 is substantially cylindrical and extends in a top-bottom direction. The battery holder 13 is configured to hold the battery 11 and is mounted to a bottom portion of the main body 12. The sleeve member 14 is removably connected to the main body 12 and sheathes the battery holder 13 and the protective cover 15. The protective cover 15 has a cover body 151 pivotally connected to the battery holder 13, and an engaging block 152 disposed on a lateral edge of the protective cover 15 that openably engages the battery holder 13.

However, since the cover body 151 has to be drawn in a transverse direction perpendicular to the top-bottom direction to disengage the engaging block 152 from the battery holder 13, and since the cover body 151 has to be further drawn in the same direction to pivot relative to the battery holder 13 to open, when the protective cover 15 is unintentionally touched and the engaging block 152 is disengaged from the battery holder 13, the protective cover 15 may be easily urged to open. As such, the battery 11 retained inside the battery holder 13 may fall off easily to cause electrical disconnection.

SUMMARY

Therefore, an object of the disclosure is to provide a microphone that can alleviate the drawback associated with the abovementioned prior art.

Accordingly, the microphone includes a main body, a battery holder, and a protective cover. The main body surrounds a longitudinal axis and extends in a top-bottom direction. The battery holder is mounted to the main body and is configured to hold a battery. The protective cover includes a cover body and a positioning unit. The cover body is pivotally connected to the battery holder and openably covers the battery holder for retaining the battery within the battery holder. The positioning unit is connected to the cover body. The protective cover is pivotable about a pivot axis which is transverse to the top-bottom direction to turn upward and downward and to move relative to the battery holder between a closed position, where the positioning unit engages the battery holder, and an opened position, where the positioning unit is disengaged from the battery holder in a direction transverse to the top-bottom direction and moved away from the battery holder.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 3:
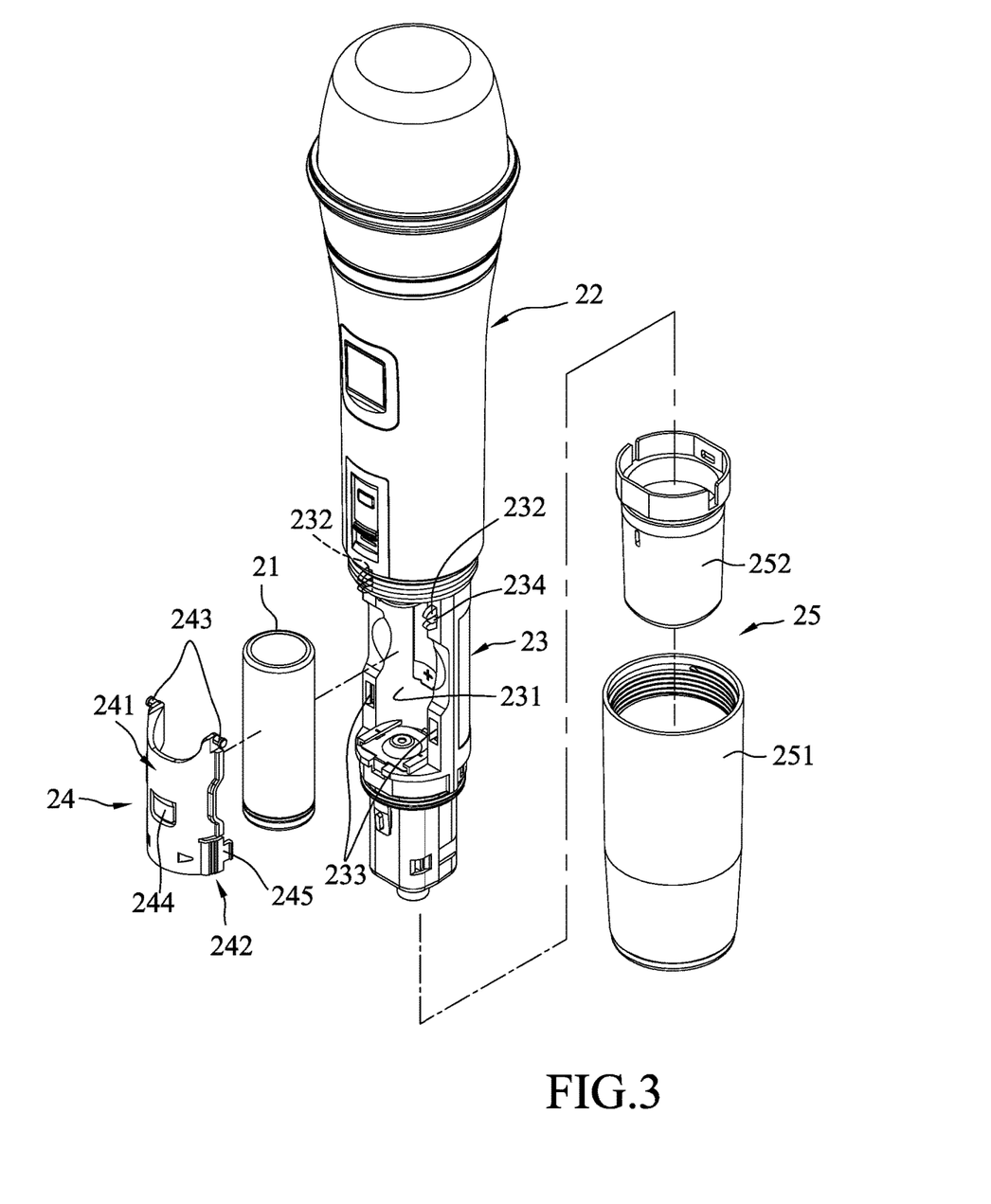
FIG. 3 is an exploded perspective view of an embodiment of a microphone according to the present disclosure.
Figure 4:
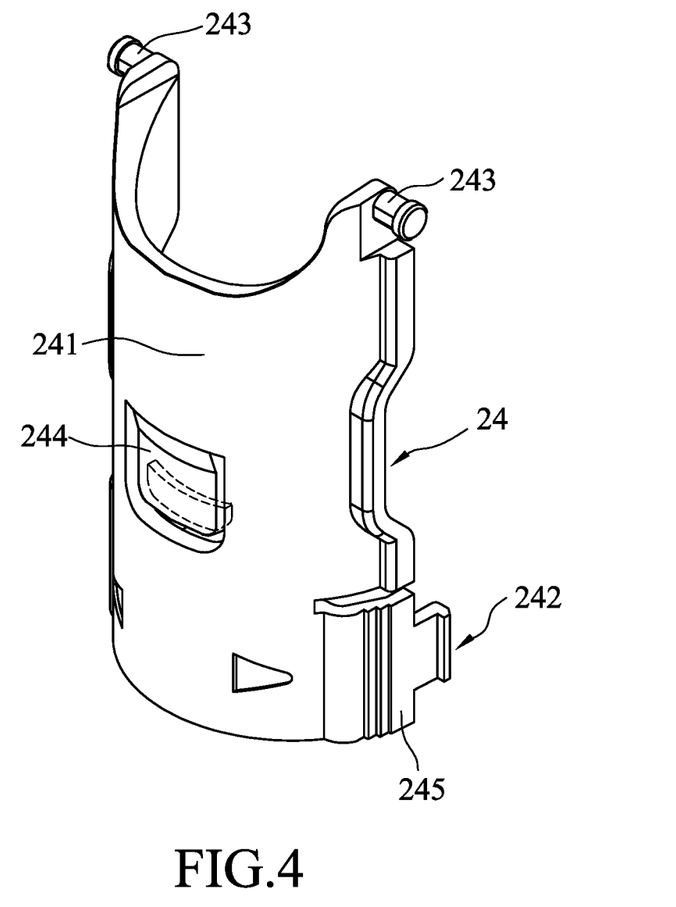
FIG. 4 is a perspective view of a protective cover of the embodiment.
Figure 5:
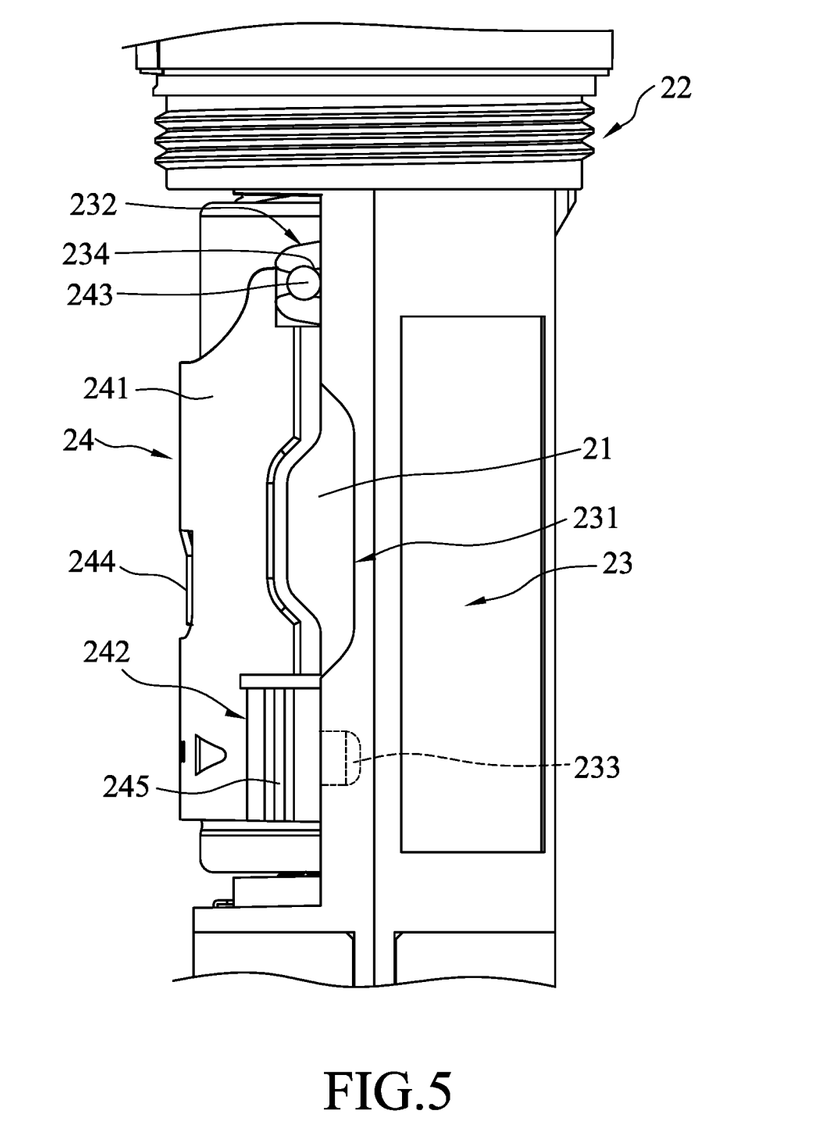
FIG. 5 is a fragmentary side view of the embodiment, illustrating the protective cover at a closed position.

Referring to FIGS. 3 to 5, an embodiment of a microphone according to the present disclosure includes a main body 22, a battery holder 23, a protective cover 24, and a sleeve unit 25.

The main body 22 surrounds a longitudinal axis that extends in a top-bottom direction. The main body 22 has a head portion for receiving sounds, and a processing unit (not shown) for converting acoustic waves into electric signals and transmitting the sounds to a speaker in a wired/wireless manner. Since the operation and manufacture of the main body 22 is known in the art, further details on the same are omitted herein for the sake of brevity.

In this embodiment, the battery holder 23 defines a retaining groove 231 that extends in the top-bottom direction and that is adapted for retaining a battery 21 therein. The battery holder 23 has a top end mounted to the main body 22, two connecting blocks 232 spaced apart from each other in a transverse direction that is substantially perpendicular to the top-bottom direction, and a bottom portion formed with two engaging grooves 233 spaced apart from each other in the transverse direction. Each of the connecting blocks 232 defines a linking recess 234 that extends along a pivot axis transverse to the top-bottom direction.

Figure 6:
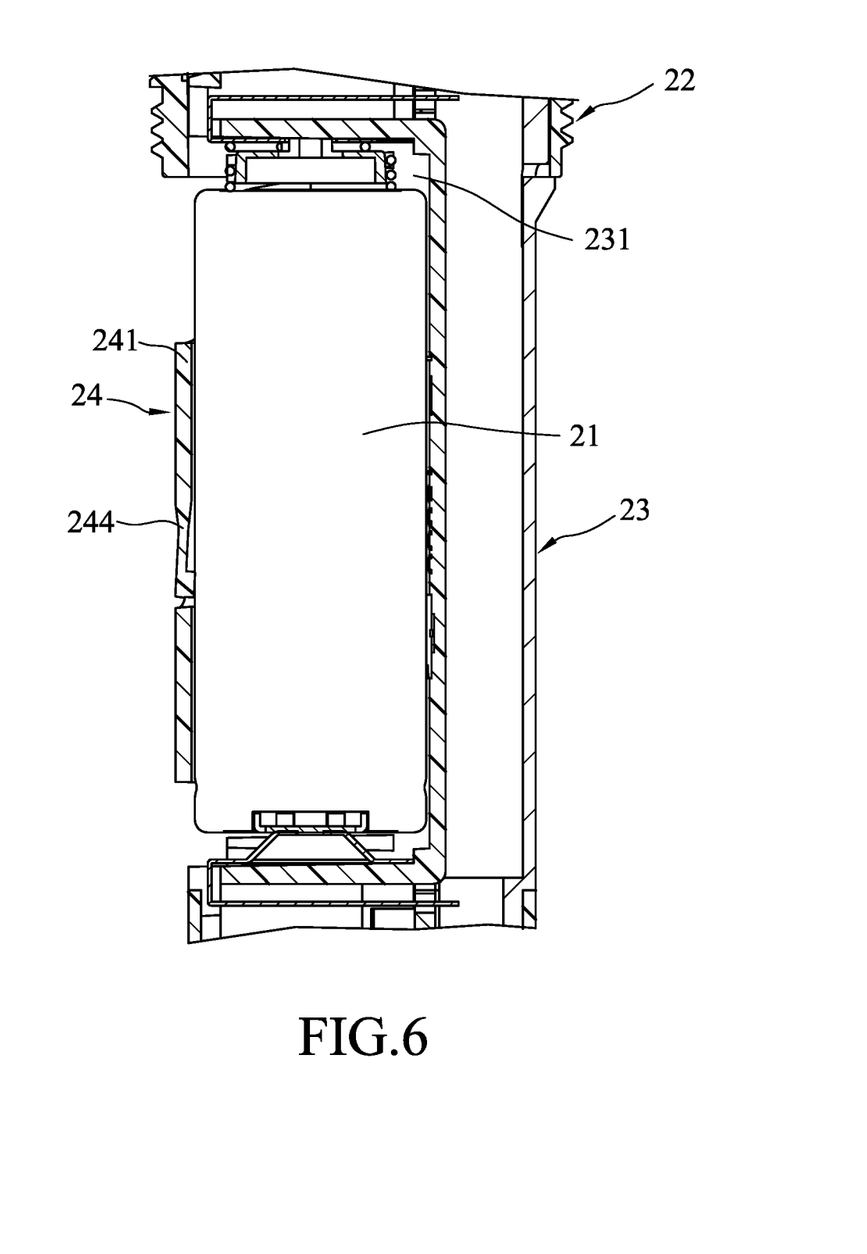
FIG. 6 is a fragmentary and partly sectional view of the embodiment, illustrating a resilient portion of the protective cover that is in abutment against a battery.
Figure 7:
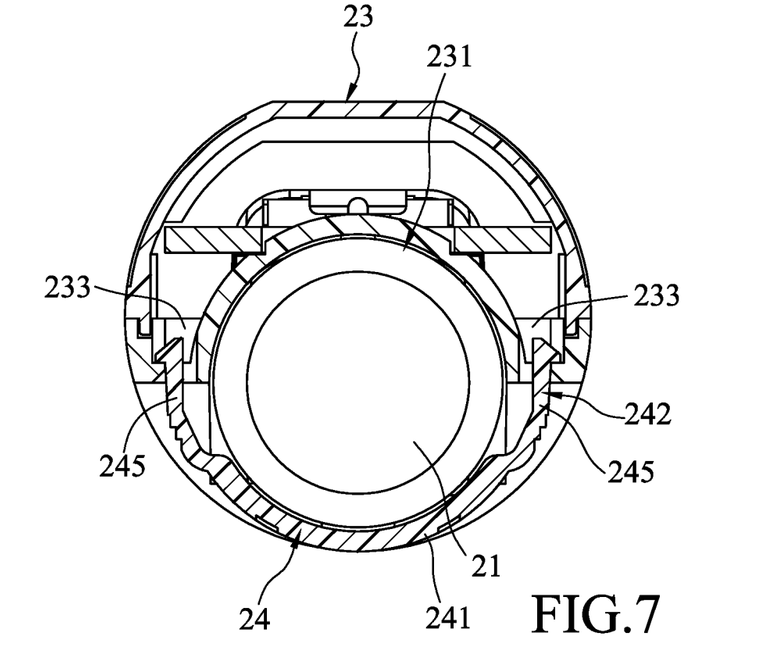
FIG. 7 is a partly sectional view of the embodiment, illustrating two pressing members of the protective cover that engage the battery holder.

Referring to FIGS. 4, 6 and 7, the protective cover 24 includes a cover body 241 and a positioning unit 242. In this embodiment, the cover body 241 is configured as a curved plate that extends longitudinally, that is curved about the longitudinal axis of the main body 22 in a curved direction transverse to the top-bottom direction, and that is pivotally connected to and openably covers the battery holder 23 for retaining the battery 21 within the retaining groove 231. Specifically, the cover body 241 has a top portion having two opposite pivot segments 243 that extend along the pivot axis, and that respectively and rotatably engage the linking recesses 234 of the connecting blocks 232. The cover body 241 further has a central portion that is disposed under the top portion, and a resilient portion 244 that protrudes inward from the central portion. The positioning unit 242 includes two pressing members 245 that are respectively disposed on two lateral sides of the cover body 241, and that are opposite to each other in the curved direction. The pressing members 245 have hooks that are respectively engageable respectively with the engaging grooves 233 of the battery holder 23.

Referring back to FIG. 3, the sleeve member 25 includes a sleeve shell 251 removably connected to the main body 22 and covering the battery holder 23, and a bottom shell 252 removably connected to a bottom end of the sleeve shell 251. Since the configuration of the sleeve member 25 is well-known in the art, further details on the same are omitted herein for the sake of brevity.

Figure 8:
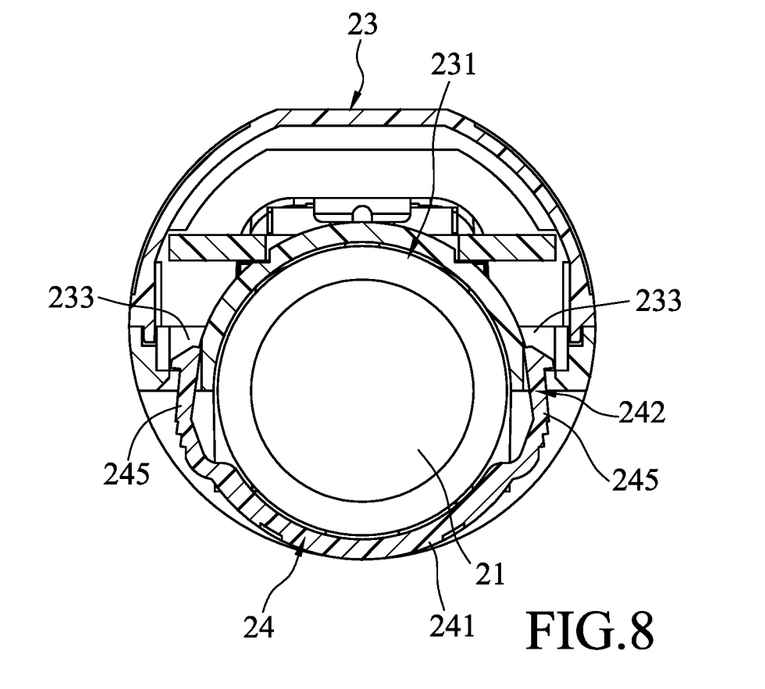
FIG. 8 is a view similar to FIG. 7, but illustrating the pressing members that are pressed toward each other to be disengaged from the battery holder.
Figure 9:
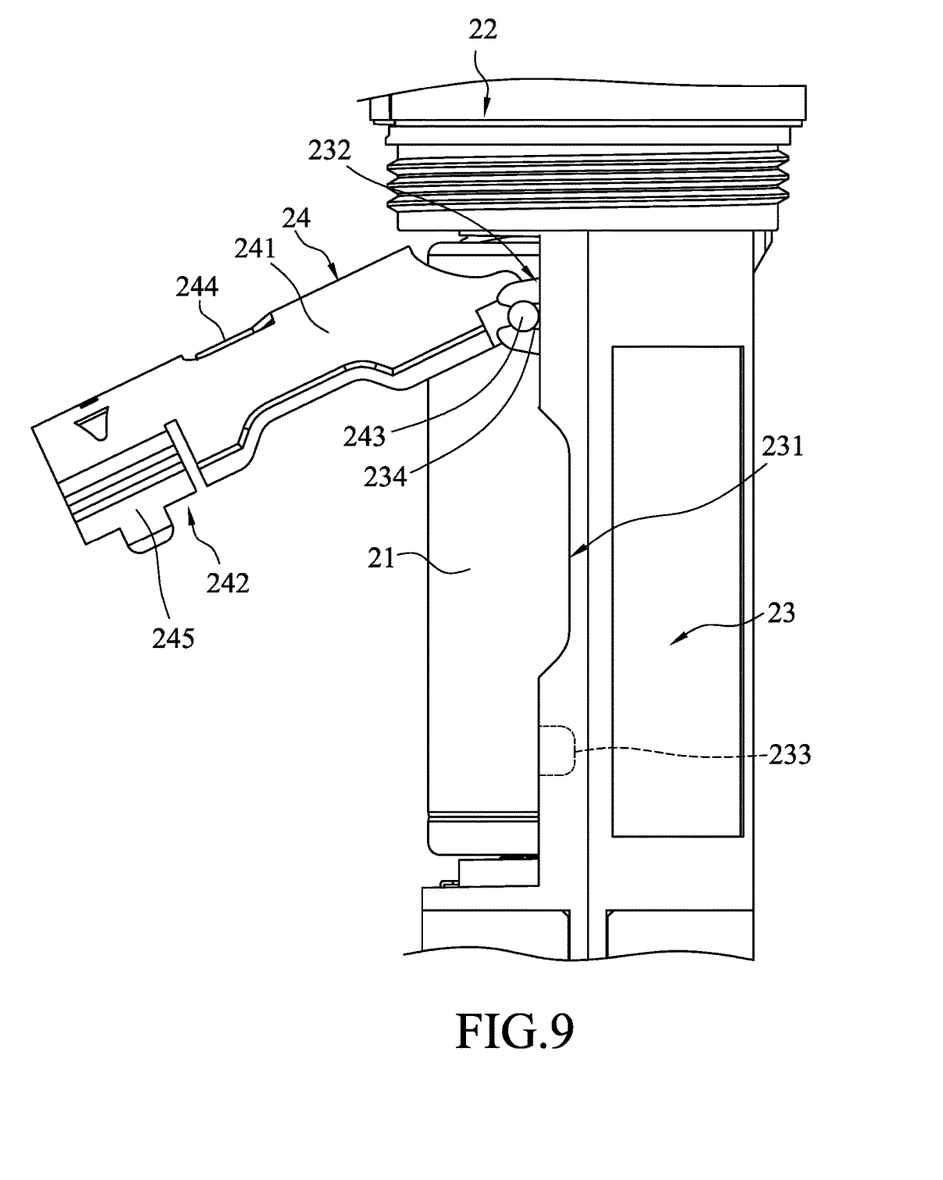
FIG. 9 is a view similar to FIG. 5, but illustrating the protective cover that is turned upward to an opened position.

After the sleeve member 25 is removed, the protective cover 242 is pivotable about the pivot axis to turn upward and downward and to move relative to the battery holder 23 between a closed position (see FIG. 5) and an opened position (see FIG. 9). When the protective cover 242 is at the closed position, the hooks of the pressing members 245 respectively engage the engaging grooves 233 of the battery holder 23. At this time, the resilient member 244 abuts against the battery 21 so as to retain the battery 21 in the battery holder 23. Referring to FIGS. 8 and 9, when intending to open the protective cover 24, the pressing members 245 are pressed toward each other to respectively disengage from the engaging grooves 23, and then the cover body 241 is pivoted to move away from the battery holder 23 from the closed position to the opened position. When the protective cover 24 is opened, the battery 21 can be removed from the battery holder 23.

In comparison with the aforesaid conventional microphone, since the direction of the movement of the pressing members 245 to be disengaged from the engaging grooves 233 is different from the direction of the pivot movement of the protective cover 24 from the closed position to the opened position, the drawback associated with the above-mentioned prior art can be alleviated. Furthermore, the configuration of the pivot segments 243 being disposed on the top portion of the cover body 241 facilitates the pivot movement of the protective cover 24 from the opened position to the closed position due to gravity. In addition, the resilient member 244 biases the battery 21 against the battery holder 23 when the protective cover 24 is at the closed position, thereby preventing electrical disconnection.

In the description above, for the purposes of explanation, numerous specific details have been set forth in order to provide a thorough understanding of the embodiment. It will be apparent, however, t one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that his disclosure is not limited to the disclosed embodiment but is intended to cover various arrangements included within the spirit and scope of the broadest interpretation so as to encompass all such modifications and equivalent arrangements.

What is claimed is:

1. A microphone comprising:
a main body surrounding a longitudinal axis that extends in a top-bottom direction;
a battery holder mounted to said main body and adapted to hold a battery;
a protective cover including
  a cover body that is pivotally connected to and openably covers said battery holder for retaining the battery within said battery holder, and
  a positioning unit that is connected to said cover body, said protective cover being pivotable about a pivot axis which is transverse to the top-bottom direction to turn upward and downward and to move relative to said battery holder between a closed position, where said positioning unit engages said battery holder, and an opened position, where said positioning unit is disengaged from said battery holder in a direction transverse to the top-bottom direction and moved away from said battery holder; and
a sleeve member removably connected to said main body and covering said battery holder;
wherein said cover body is configured as a curved plate that extends longitudinally and is curved about the longitudinal axis of said main body;
wherein said positioning unit includes two resilient pressing members respectively disposed on two lateral sides of said cover body and opposite to each other in a curved direction transverse to the top-bottom direction;
wherein said pressing members respectively have hooks that are engageable with said battery holder, and that are pressed inward and toward each other to disengage from said battery holder when said protective cover is pivoted from the closed position to the opened position;
wherein said cover body of said protective cover has a resilient portion adapted for abutment against the battery so as to retain the battery in said battery holder when said protective cover is at the closed position; and
wherein said cover body of said protective cover has a top portion pivotally connected to said battery holder.

2. The microphone as claimed in claim 1, wherein said cover body of said protective cover has a top portion pivotally connected to said battery holder.

3. A microphone comprising:
a main body surrounding a longitudinal axis that extends in a top-bottom direction;
a battery holder mounted to said main body and adapted to hold a battery; and
a protective cover including
  a cover body that is pivotally connected to and openably covers said battery holder for retaining the battery within said battery holder, and
  a positioning unit that is connected to said cover body, said protective cover being pivotable about a pivot axis which is transverse to the top-bottom direction to turn upward and downward and to move relative to said battery holder between a closed position, where said positioning unit engages said battery holder, and an opened position, where said positioning unit is disengaged from said battery holder in a direction transverse to the top-bottom direction and moved away from said battery holder;
wherein said cover body of said protective cover has a top portion pivotally connected to said battery holder.

4. The microphone as claimed in claim 3, further comprising a sleeve member removably connected to said main body and covering said battery holder.

* * * * *